United States Patent [19]

De Blok

[11] Patent Number: 5,500,757

[45] Date of Patent: Mar. 19, 1996

[54] OPTICAL RECEIVING SYSTEM

[75] Inventor: Cornelis M. De Blok, Hazerswoude-Rijndijk, Netherlands

[73] Assignee: Koninklijke PTT Nederland N.V., Netherlands

[21] Appl. No.: 251,581

[22] Filed: May 31, 1994

[30] Foreign Application Priority Data

Jun. 11, 1993 [NL] Netherlands .................. 9301026

[51] Int. Cl.⁶ .................................. H04B 10/04
[52] U.S. Cl. .................. 359/189; 359/183; 359/184; 359/195; 375/362
[58] Field of Search .................. 359/183, 182, 359/184, 185, 188, 181, 173, 189, 193, 195; 375/111, 114, 118

[56] References Cited

FOREIGN PATENT DOCUMENTS 0424741  5/1991  European Pat. Off. ........ H04L 7/033

OTHER PUBLICATIONS

G. W. McNally, "Dynamic Range Control of Digital Audio Signals", *Journal of the Audio Engineering Society*, 32(1984) May, No. 5, New York, pp. 316–327

K. Beomsup et al., "A 30–MHz Hybrid Analog/Digital Clock Recovery Circuit in 2–um CMOS", *IEEE Journal of Solid–State Circuits*, 25(1990) Dec., No. 6, New York, pp. 1385–1994.

*Courier EMT Franz GmbH*, Jun. 1979, "EMT266 Transient Limiter with preliminary delay and adaptive preemphasis", pp. 9–11. (and cover).

*IBM Technical Disclosure Bulletin*, vol. 28, No. 10, Mar. 1986, "Edge–Detection Circuit", pp. 4403–4405.

*Primary Examiner*—Leo Boudreau
*Assistant Examiner*—Rafael Bacares
*Attorney, Agent, or Firm*—Peter L. Michaelson; Jeffery J. Brosemer

[57] ABSTRACT

Optical receiving system, incoming unipolar pulses being converted into bipolar pulses having a constant top amplitude (elements 2, 3 and 4) which, on the one hand, are used for generating replicas of the original pulses, but having a constant top amplitude (element 5) and, on the other hand, for eliminating mutual phase differences by means of phase comparison with local clock pulses (elements 7..14). The latter is preferably effected by the bipolar pulses being multiplied (element 7) by the clock pulses, and by using the resulting DC signal to control a controllable delay element (8).

3 Claims, 1 Drawing Sheet

OPTICAL RECEIVING SYSTEM

BACKGROUND OF THE INVENTION

The invention relates to an optical receiving system, comprising an optical/electrical converter for converting optical input pulses into electrical output pulses.

SUMMARY OF THE INVENTION

The invention makes provision for an optical receiving system which is found to be eminently suitable for highly reliable transmission of so-called "burst mode" pulse-like signals. In particular, the system according to the invention is found to be eminently satisfactory in the transmission of ATM data cells. The receiving system according to the invention is especially designed for the reception and transmission, in a network exchange, of ATM data cells from local, passive optical networks (PONs) where it is possible for the ATM cells originating from different subscribers to have different pulse amplitudes, as a result of the different distances between the subscribers and the network exchange. Moreover, owing to these different distances, phase differences arise between the incoming signals and the system clock in the receiving system. In the system according to the invention, a number of measures are combined some of which are known per se but which are eminently suitable for being combined with one another to give a system which is inexpensive and has a high processing speed, which makes the system very suitable for ATM applications.

The invention comprises two subsystems which can be used independently per se but which preferably together form the system according to the invention.

The first subsystem comprises a first pulse/pulse converter (2), such as a delay line differentiator, for converting output pulses of the optical receiver (1) into pulses having a pulse width which is small compared to that of the original pulses, and having constantly alternating polarity, whose appearance times correspond to the appearance times of leading and trailing edges of the original pulses and whose amplitudes are equal to the amplitudes of the original pulses; a feed-forward-connected amplitude-correction element (3,4) for converting the output pulses of the said pulse/pulse converter into pulses of constant top amplitude; and a second pulse/pulse converter (5), such as an integrator, for converting the bipolar output pulses of the amplitude-correction element into unipolar pulses—replicas of the original pulses—of which the appearance times of the leading and trailing edges correspond to the appearance times of the output pulses, whose polarity alternates, of the amplitude-correction element.

The second subsystem comprises a phase comparator (9,10,11,7) for comparing the phase of the pulses emitted by the said optical/electrical converter (1), or of representatives thereof, with the phase of the pulses emitted by a system clock generator and emitting, as a function of the comparison result, a control signal to a delay element (8), there being presented, to a first input of the phase comparator, the output pulses of the optical/electrical converter or representatives thereof, and, at a second input, the pulses emitted by a system clock generator, while the said control signal is taken off an output of that phase comparator, the delay time of the said delay element being controlled in such a way by that control signal originating from the phase comparator that the pulses presented to that delay element are delayed in accordance with the difference between the phase of those pulses originating from the optical/electrical converter and the phase of the clock pulse generator.

DETAILED DESCRIPTION OF THE PREFERRED EMBODIMENT

Figure 1:
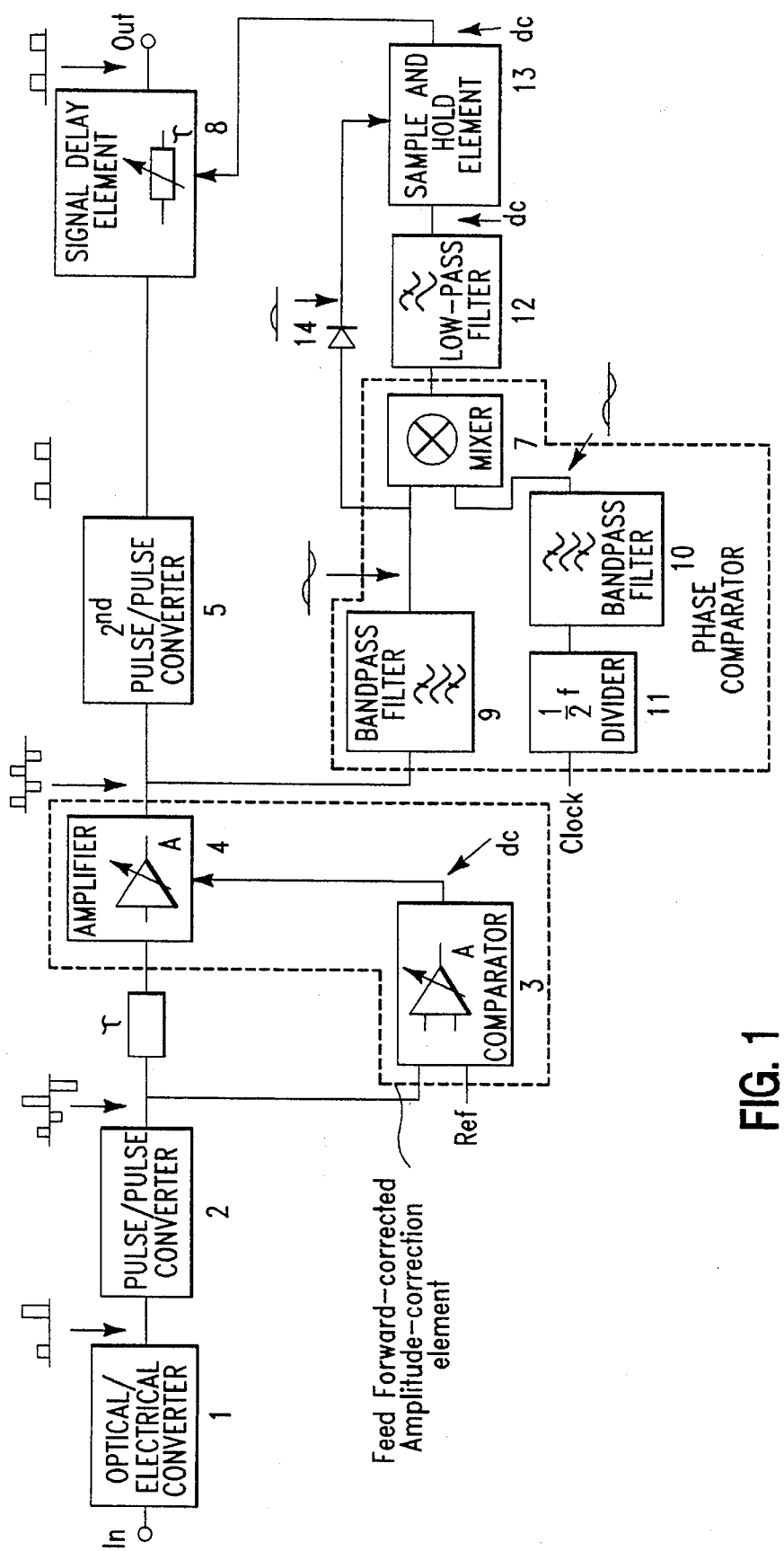
FIG. 1 shows a preferred embodiment of our inventive optical receiving system.

In the following, a specific embodiment of a system according to the invention will be discussed with reference to FIG. 1.

Via a passive optical network there are presented, at the input of the system shown—situated in a network centre—the ATM data cells, formed by pulse bursts and originating from different subscribers. In an optical/electrical converter 1, formed by a photodiode with an appertaining amplifier, as disclosed, for example, by Patent Application NL8700328 in the name of the Applicant, the optical pulse sequences presented, which make up the ATM data cells, are converted into corresponding electrical pulse sequences. The amplifier is an AC-coupled amplifier one of whose advantages is that the influence of thermal effects (drift) is minimal. One problem in the further processing of these data cells is that the pulse amplitudes of data cells originating from different subscribers may differ substantially since, after all, the subscribers are located at different distances from the network centre. Consequently, since considerable variations in the DC component arise, pulse detection by means of a fixed detection threshold is not possible. Furthermore, owing to transit time differences, differences arise in the phases of pulse sequences which originate from different subscribers.

First Subsystem:

In order to "standardize" the pulse amplitudes, these are processed in a correction element 4 which is feed-forward-controlled by the output of an amplitude-comparison element 3. In order to eliminate, in these elements, the (undesirable) effect of the DC component of the signal, the output signal of the O/E converter is converted, in a pulse/pulse converter 2, into peak-shaped pulses of alternating polarity, the positive peaks of which correspond to the leading edges of the pulses fed in and the negative peaks correspond to the trailing edges of these pulses. To this end, use is made of a so-called "delay line differentiator" as is disclosed, inter alia, by the Patent Application NL9201003 in the name of the Applicant. The unipolar input pulses are thus converted into bipolar peaks whose average value per cycle is zero. The amplitudes of the peak-shaped pulses—which correspond to the amplitudes of the original pulses—are then "standardized" in the elements 3 and 4. Element 3 is a comparator which compares a reference signal A with the (absolute value of the) top value of the signal peaks fed in, and emits a control signal whose amplitude is proportional to the difference between those two. The control signal is presented to an amplifier 4 whose gain can be controlled by the control signal (instead of an amplifier it is also possible to use a controllable attenuator). Thus there results, at the output of the controllable amplifier 4, a peak-shaped bipolar signal of which the absolute value of the peaks is constant. From this output signal, a unipolar pulse signal is then again recovered by presenting the peak-shaped output signal to the input of a second pulse/pulse converter, this being a set/reset circuit which at its output at all times emits a positive signal after the appearance of a positive input peak ("set"), until there appears, at its input, a negative peak ("reset").

Second Subsystem:

As stated above, the different pulse sequences (the ATM cells) generally have different phases. The "standardization" thereof takes place in a subsystem which is formed by the elements 9, 10, 11 and 7, the phase comparator. The phase of the output signal of element 4, consisting of amplitude-standardized bipolar peak-shaped pulses is compared with the phase of a reference clock signal (the local system clock signal). There appears at the output of the phase comparator a control signal whose amplitude is a measure for the phase difference between the two pulse signals fed in. The control signal controls a variable delay line 7, as a result of which phase differences are compensated for.

The phase comparator is formed by two bandpass filters 9 and 10, via which the output signal of element 4 and the (local) system clock signal, respectively, are fed to a mixing stage 7. At the outputs of the filters 9 and 10 there appear sinusoidal signals. Since—as is usual—the clock cycle time (the time required for a clock 1 bit and a clock 0 bit) corresponds to the pulse time (bit time, the time for either a signal 1 bit or a signal 0 bit), the clock frequency has to be halved, in a divider 11, prior to being presented to the filter 10, for the frequencies of the output signals of filter 9 and 10 to be equal. The two signals thus processed are mixed multiplicatively (multiplied) in mixing stage 7. The output signal is a DC signal which can be used to control the delay element 8 and whose amplitude corresponds to the phase difference of the sinusoidal signals fed in:

$\cos a \cdot \cos b = \frac{1}{2} \cos(a-b) + \frac{1}{2} \cos(a+b)$

Output signal of filter $9 = A \cos(\omega\tau+\phi)$

Output signal of filter $10 = A \cos(\omega\tau)$

Multiplication of the two signals—in mixing stage 7—results in:

$$A \cos(\omega t + \phi) \cdot A \cos(\omega t) = A^2 \{1/2 \cos(\omega t + \phi - \omega t) + 1/2 \cos(\omega t + \phi + \omega t)\}$$
$$= 1/2 A^2 \{\cos(\phi) + (\cos 2\omega t + \phi)\}$$

The term $\frac{1}{2}A^2 \cos(\phi)$ is the required DC control signal (since $\omega$ is absent), whose size is a measure for the phase difference $\phi$ between the two signals; the term $(\cos 2\omega\tau+\phi)$ is an AC signal which is filtered out in a low-pass filter 12.

In order to ensure that the delay element 8 is only set when (unipolar) pulses are actually received, there is incorporated, between the mixing stage 7 and the controllable delay element 8, a "sample & hold" element 13 which is controlled by the rectified output signal—via a diode 14—of filter 9. As long as no pulses appear, the DC control signal is not modified at the delay element 8. If pulses appear at the input of the system, these are converted into bipolar, peak-shaped pulses (element 2) having a standardized amplitude (element 4), serving, on the one hand, for generating pulse replicas having standardized amplitude (element 5), on the other hand serving for generating an AC signal (filter 9) which is multiplied (element 7) by an AC signal derived (elements 10 and 11) from the system clock, the result being a DC control signal (element 12); the AC output signal drives—via diode 14—the "sample & hold" element 13 into an open state, as a result of which the delay element 8 is once more set by the DC control signal having the value $\frac{1}{2}A^2 \cos(\phi)$. Finally it should be noted that it is not absolutely necessary to filter the input signals of the mixing stage 7 through the filters 9 and 11. Certainly, since the various pulses in practice are by no means perfectly square, but tend to a sinusoidal shape, it is in practice generally possible to omit the filters 9 and 11.

In practice, the above presented receiver appears to be a very attractive, well-operating device, especially in the environment of transmission of ATM datacells in local PONs. The success of this rather simple receiver is ascribed to the synergetic effect of using said bipolar, peak-shaped pulses simultaniously as input for the generation of standardized replicas of the original signal pulses, resulting in well-detectable pulses, and as input for the generation of a phase correction signal, resulting in phase corrected pulses, well-suited for further processing.

I claim:

1. Optical receiving system, comprising an optical/electrical converter for converting optical input pulses into electrical output pulses, wherein:

a first pulse/pulse converter (2), such as a delay line differentiator, converts output pulses of the optical receiver (1) into pulses having a pulse width which is small compared to that of the original pulses, and having constantly alternating polarity, whose appearance times correspond to the appearance times of leading and trailing edges of the original pulses and whose amplitudes are equal to the amplitudes of the original pulses;

a feed-forward-connected amplitude-correction element (3,4) which converts the output pulses of the said pulse/pulse converter into pulses of constant top amplitude; a second pulse/pulse converter (5), such as an integrator, which converts the bipolar output pulses of the amplitude-correction element into unipolar pulses—replicas of the original pulses—of which the appearance times of the leading and trailing edges correspond to the appearance times of the output pulses, whose polarity alternates, of the amplitude-correction element;

a phase comparator (9,10,11,7) which compares the phase of the pulses emitted by the said optical/electrical converter (1), or of representatives thereof, with the phase of the pulses emitted by a system clock generator and emits, as a function of the comparison result, a control signal to a delay element (8), there being presented, to a first input of the phase comparator, the output pulses of the optical/electrical converter or representatives thereof, and, at a second input, the pulses emitted by a system clock generator, while the said control signal is taken off an output of that phase comparator, the delay time of the said delay element being controlled in such a way by that control signal originating from the phase comparator that the pulses presented to that delay element are delayed in accordance with the difference between the phase of those pulses originating from the optical/electrical converter and the phase of the clock pulse generator; and wherein the output bipolar output pulses of the amplitude-correction element (4) are presented to the said first input (9) of the phase comparator.

2. Optical receiving system according to claim 1, wherein the phase comparator comprises a mixing stage (7) and the two input signals of the phase comparator, or representatives of those two input signals, are mixed together multiplicatively, the DC component of the mixing product being presented as a control signal to the said delay element (8).

3. Optical receiving system according to claim 1, wherein the phase comparator comprises a mixing stage (7) and the two input signals of the phase comparator, or representatives of those two input signals, are mixed together multiplicatively, the DC component of the mixing product being presented as a control signal to the said delay element (8).

* * * * *